United States Patent
Novac (10) Patent No.: US 7,030,709 B2
(45) Date of Patent: Apr. 18, 2006

(54) OSCILLATOR CIRCUIT WITH AN INVERTER AMPLIFIER HAVING REDUCED CONSUMPTION

(75) Inventor: Pinchas Novac, Neuchâtel (CH)

(73) Assignee: EM Microelectronic - Marin SA, Marin (CH)

( * ) Notice: Subject to any disclaimer, the term of this patent is extended or adjusted under 35 U.S.C. 154(b) by 47 days.

(21) Appl. No.: 10/485,463

(22) PCT Filed: Aug. 1, 2002

(86) PCT No.: PCT/EP02/08586

§ 371 (c)(1),
(2), (4) Date: Feb. 2, 2004

(87) PCT Pub. No.: WO03/017462

PCT Pub. Date: Feb. 27, 2003

(65) Prior Publication Data

US 2004/0169562 A1   Sep. 2, 2004

(30) Foreign Application Priority Data

Aug. 13, 2001   (EP) .................................. 01203052

(51) Int. Cl.
*H03B 5/04* (2006.01)
(52) U.S. Cl. ................. 331/158; 331/116 FE; 331/116 R; 331/175; 331/186
(58) Field of Classification Search ................. 331/158, 331/185, 116 R, 74
See application file for complete search history.

(56) References Cited

U.S. PATENT DOCUMENTS

| | | | |
|---|---|---|---|
| 4,360,789 A | | 11/1982 | Lewyn et al. |
| 5,208,558 A | * | 5/1993 | Shigehara et al. ..... 331/116 FE |
| 5,557,243 A | * | 9/1996 | Ho .............................. 331/158 |
| 5,909,152 A | | 6/1999 | Li et al. |
| 6,025,757 A | | 2/2000 | Tsukagoashi et al. |

FOREIGN PATENT DOCUMENTS

| | | |
|---|---|---|
| EP | 886372 A2 | 12/1998 |
| EP | 1111770 A1 | 12/1999 |
| JP | 60-64506 | 4/1985 |

* cited by examiner

*Primary Examiner*—Arnold Kinkead
(74) *Attorney, Agent, or Firm*—Sughrue Mion, PLLC (57) ABSTRACT

There is disclosed an inverter oscillator circuit delivering an alternating output signal and including a parallel arrangement, between an input terminal and output terminal, of an inverter amplifier means, a resonator, and a resistor, first and second load capacitors being respectively connected between said input and output terminals, on the one hand, and a supply potential, on the other hand. Control means for controlling the inverter amplifier means such that it has a so called start-up transconductance value during a start-up phase and a so-called reduced transconductance value, lower than said start-up transconductance value, in steady state at the end of said start-up phase. Means for smoothing an amplitude decrease in the output signal resulting from the passage of said start-up transconductance value to said reduced transconductance value is included.

12 Claims, 5 Drawing Sheets

OSCILLATOR CIRCUIT WITH AN INVERTER AMPLIFIER HAVING REDUCED CONSUMPTION

BACKGROUND OF THE INVENTION

The present invention generally concerns an oscillator circuit with an inverter amplifier (herein after called an inverter oscillator circuit) having reduced consumption. More particularly, the present invention concerns a relatively low frequency inverter oscillator circuit preferably including a quartz resonator arranged to vibrate according to a torsional vibration mode.

There is already known from European Patent No. EP 1 111 770 A1, in the name of Eta SA Fabriques d'Ebauches and EM Microelectronic-Marin SA, a low frequency quartz oscillator device having improved thermal behaviour. This Application, which is incorporated herein by reference, discloses an inverter type oscillator including a specific quartz resonator arranged to vibrate according to a torsional vibration mode. This specific resonator, which is disclosed in the article by Messrs. Roger Bourquin and Philippe Truchot, "Barreau de quartz vibrant en mode de torsion, Application aux capteurs", $6^{th}$ European Chronometry Congress, Bienne, 17–18 Oct. 1996 (cited and incorporated by reference in the aforementioned European Patent Application), has a single cut angle defined by a rotation about the crystallographic axis X of the quartz crystal, and includes, in particular, an undesired fundamental flexural vibration mode located at a first frequency and a desired torsional vibration mode located at a second frequency higher than the first frequency of the undesired flexural vibration mode.

The circuit for maintaining the resonator's oscillation is of the inverter type. In order to ensure that the resonator vibrates according to the desired fundamental torsional vibration mode, and not according to the undesired fundamental flexural vibration mode, the inverter circuit is designed to have a transconductance value such that the limit conditions for ensuring vibration (or minimum and maximum critical transconductance values) are satisfied for the fundamental torsional vibration mode and not for the fundamental flexural vibration mode.

The thermal behaviour of the oscillator device thus designed is therefore greatly improved with respect to conventional oscillator devices and has, in particular, similar thermal behaviour to circuits using AT cut resonators for a considerably lower operating frequency (typically 393 kHz for the torsional resonator compared to 4 MHz for the AT cut resonator) and thus a comparatively lower consumption.

SUMMARY OF THE INVENTION

Leaving aside the advantages in terms of thermal stability, the consumption of the oscillator circuit disclosed in the aforementioned European Patent Application remains, however, comparatively higher than those of conventional low frequency oscillator circuits. The main object of the present invention is thus to propose an oscillator circuit having a more reduced consumption, this oscillator circuit preferably, but not necessarily, including a torsional vibrating resonator of the aforementioned type.

Figure 1A:
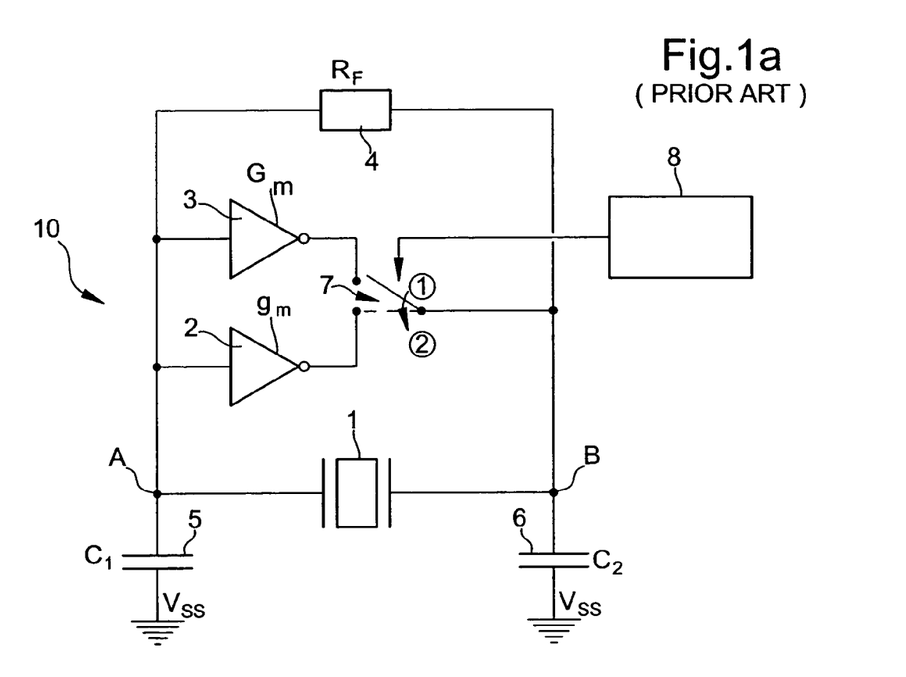
FIGS. 1*a* and 1*b*, already presented, show two functional diagrams of an inverter oscillator circuit disclosed in the aforementioned Japanese document No. JP 60-64506.
Figure 1B:
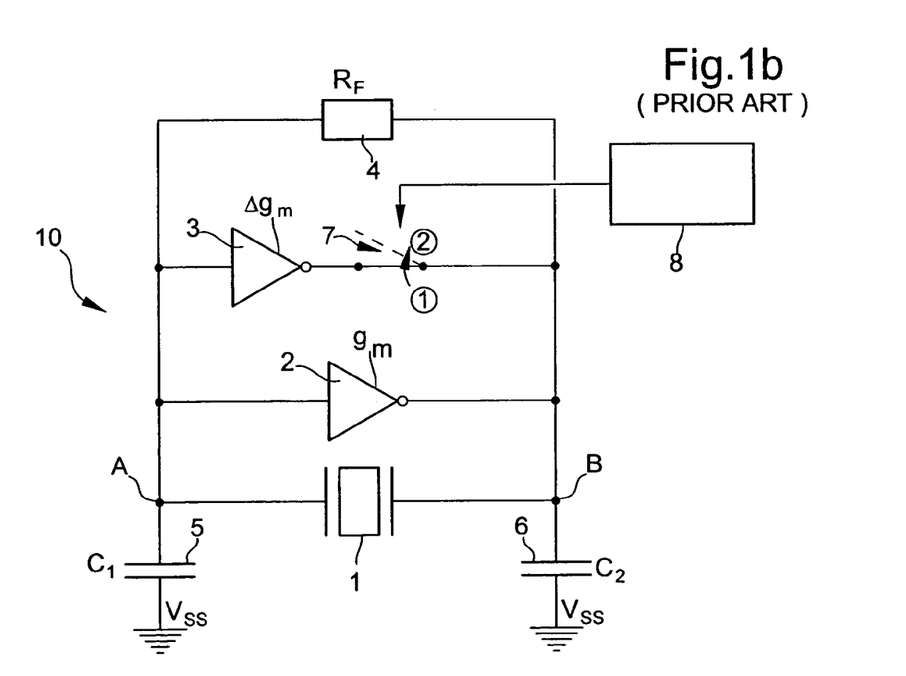

It will be noted that a solution allowing the consumption of an oscillator circuit to be reduced is already known from Japanese Patent Application No. JP 60-64506 in the name of Fujitsu Ltd., filed on 20 Sep. 1983. FIGS. 1a and 1b show two functional diagrams of this inverter oscillator circuit, globally indicated by the reference numeral 10. Globally, each of the oscillator circuits illustrated corresponds to a conventional inverter oscillator circuit including, in particular, the parallel arrangement, between input terminal A and output terminal B, of inverter amplifier means 2, 3, a resonator 1 and a resistive element 4, called a feedback resistor, of value $R_F$. First and second load capacitors 5, 6 are respectively connected between input terminal A and output terminal B, on the one hand, and a supply potential, here $V_{SS}$, on the other hand.

This oscillator circuit 10 further includes control means 8 and a switching means 7 for controlling inverter amplifier means 2, 3 such that it has a first transconductance value during a start-up phase and a second transconductance value, lower than the first transconductance value, in steady state at the end of the start-up phase.

More precisely, oscillator circuit 10 of FIG. 1a includes a first inverter 2 having a first transconductance value, designated $g_m$, and a second inverter 3 having a second transconductance value, designated $G_m$, higher than first transconductance value $g_m$. Switching means 7 is arranged so as to selectively connect first inverter 2 or second inverter 3 between the input and output terminals A, B. During the start-up phase, switching means 7 is in position "1" so as to connect the second inverter between terminals A and B. As soon as the oscillations are stable, in steady state, switching means 7 passes into position "2" via the action of control means 8.

Oscillator circuit 10 of FIG. 1b is substantially similar to the circuit of FIG. 1a. Second inverter 3 has here only an additional or complementary value, designated $\Delta g_m$, which is added to transconductance value $g_m$ of first inverter 2 during the start-up phase. Switching means 7 is thus connected such that second inverter 3 is connected in parallel with first inverter 2 during the start-up phase (switching means 7 in position "1") and disconnected from second inverter 2 in steady state (switching means 7 in position "2").

It will be noted that the use of the solutions proposed in the aforementioned Japanese document may have several drawbacks. In particular, the effect of the decrease in transconductance value during switching at the end of the start-up phase is a decrease in current (and thus in consumption) which also results in an abrupt decrease in the amplitude of the oscillator's output signal. This switching of the oscillator circuit can, in particular, lead to significant damping of the resonator's oscillations, which may eventually lead to it stopping totally or to a modification in its vibration mode. In particular, the inventor has been able to observe that if the solution proposed in the aforementioned Japanese document were directly associated with the aforementioned resonator arranged to vibrate torsionally, it would lead either to the resonator stopping totally or to a modification in its vibration mode to the undesired fundamental flexural vibration mode.

It will also be noted that the abrupt decrease in amplitude in the oscillator's output signal can also be a drawback for the peripheral elements associated with the oscillator circuit.

The use of the principle set forth in the aforementioned Japanese Patent Application, in particular in association with the oscillator circuit of European Patent Application No. EP 1 111 770 A1 mentioned in the preamble, thus requires very particular care, given the specific conditions that the oscillator has to satisfy so that the resonator vibrates according to the desired vibration mode.

Another object of the present invention is thus to propose an oscillator circuit with reduced consumption which can easily be integrated in a global system, which does not generate disturbances to the system and which assures that the resonator's oscillations are adequately maintained. In particular, in the case in which the oscillator circuit employs a torsionally vibrating quartz resonator of the aforementioned type, a solution guaranteeing that the torsional vibration mode is maintained in addition to the reduction in consumption is desired.

Yet another object of the present invention is to push the reduction in consumption of the circuit further still and to propose a solution that consumes even less energy.

Another object of the present invention is to propose a method for maintaining the oscillations of a resonator of the aforementioned type guaranteeing, on the one hand, a reduction in consumption, and, on the other hand, that the oscillations of the resonator according to the desired fundamental torsional vibration mode are maintained.

The present invention thus concerns an inverter oscillator circuit whose features are set forth in the claims.

The present invention also concerns a method for maintaining the oscillations of a resonator of the aforementioned type whose features are set forth in the claims.

Advantageous embodiments of the present invention form the subject of the independent claims.

With reference to the aforementioned European Patent Application No. EP 1 111 770 A1, it will be noted as regards the specific resonator arranged to vibrate according to a torsional vibration mode, that the circuit maintaining the resonator's vibrations is arranged to force the resonator to vibrate according to the desired torsional vibration mode and that, in order to do this, the transconductance value of the inverter is chosen to be higher than the maximum transconductance value, designated $g_{m,max}$, associated with the undesired flexural vibration mode. Since transconductance is normally representative of the current consumed by the circuit, it will thus be understood that the circuit consumes more when it is arranged to force the resonator to vibrate according to the torsional vibration mode than when the same circuit is arranged to vibrate according to the conventional flexural vibration mode.

However, according to the present invention, the inventor has been able to observe that the consumption of the circuit can be reduced once the oscillator circuit is started and its output signal is stable. In particular, it is possible to start the circuit such that the resonator vibrates according to the desired torsional mode satisfying the strict criteria determined by the critical transconductance values defined in the aforementioned European Patent Application, and, at the end of this start-up phase, to reduce consumption while guaranteeing that the resonator still vibrates according to this torsional vibration mode. This reduction in consumption is partially obtained by switching the circuit, during the so-called steady state phase following the start-up phase, into another state where the latter has a reduced transconductance value with respect to the initial transconductance value defined for the start-up.

Advantageously, the inventor has been able to observe that the transconductance value of the inverter may be reduced to a lower value than the critical transconductance value below which the resonator's oscillations in the torsional vibration mode are normally no longer guaranteed. The inventor has thus observed that the critical transconductance values are essentially determining during the resonator start-up phase. For the sake of security, it is nonetheless perfectly possible to envisage keeping the transconductance value of the circuit within a range of values preventing the resonator from vibrating according to the torsional vibration mode.

In addition to reducing consumption in steady state, the present invention also assures that the oscillator circuit starts quickly via the selection of a high transconductance value during this initial phase.

According to the invention, the oscillator circuit is also fitted with means allowing the alternating signal output amplitude to be smoothed during the passage from the start-up phase into steady state, i.e. when the circuit's transconductance value is reduced. This smoothing of the output signal amplitude limits the effects of switching the oscillator circuit's transconductance value and guarantees that the resonator's oscillations are not damped too abruptly in order to ensure that the resonator continues to vibrate according to its desired vibration mode. Moreover, this smoothing facilitates integration of the oscillation circuit into a global system, the disturbances caused by switching the oscillator circuit from one state to another being minimised.

According to other embodiments of the present invention, complementary means are used to reduce the oscillator circuit's consumption in steady state. According to a first of these embodiments, resistive elements are connected in series in the supply path of the inverter circuit. According to another of these embodiments of the invention, the circuit further includes a voltage regulator for lowering the supply voltage of the inverter circuit.

BRIEF DESCRIPTION OF THE DRAWINGS

Other features and advantages of the present invention will appear more clearly upon reading the following detailed description, made with reference to the annexed drawings, given by way of non-limiting example, and in which.

DETAILED DESCRIPTION OF THE INVENTION

Figure 2:
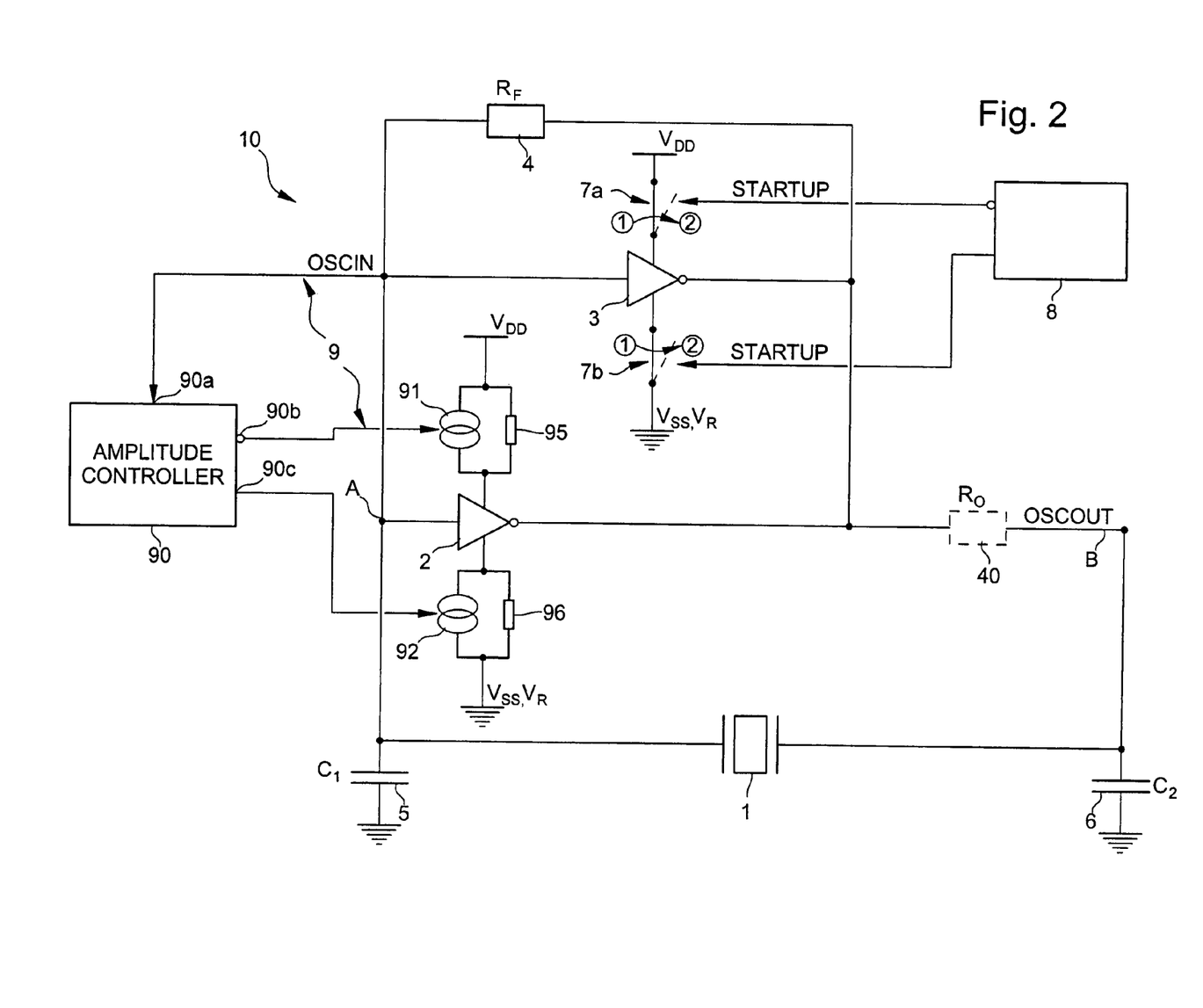
FIG. 2, shows a general diagram of the inverter oscillator circuit according to the present invention.

FIG. 2 shows a general functional diagram of an inverter type oscillator circuit constituting a preferred embodiment of the present invention. The inverter oscillator circuit 10 illustrated in FIG. 2 typically includes the parallel arrangement, between input terminal A and output terminal B, of inverter amplifier means including first and second inverters 2, 3, a resonator 1 and a resistor 4, first and second load capacitors 5, 6 being respectively connected between said input and output terminals A, B, on the one hand, and a supply potential, here $V_{SS}$, on the other hand. Oscillator circuit 10 may further include an additional resistive element 40, of value $R_0$, arranged between the output of inverters 2, 3, on the one hand, and resonator 1 as well as load capacitor 6, on the other hand. This optional resistive element 40 is in particular intended for increasing the stability of the oscillator circuit.

The arrangement of the two inverters 2, 3 is substantially similar to the arrangement illustrated in FIG. 1b, i.e. first inverter 2 is permanently connected between input and output terminals A and B, whereas second inverter 3 is able to be connected to or disconnected from these terminals A, B via the action of control circuit 8. In this case, second inverter 3 is activated or deactivated using switching means (namely two switches 7a and 7b controlled by control circuit 8) placed in the supply path of the inverter, between supply potentials $V_{DD}$ and $V_{SS}$.

It will be noted that second inverter 3 could alternatively be connected to or disconnected from terminals A and B by means of a switch connected in series with this inverter, for example by means of a transmission gate including the parallel arrangement of an n-MOS transistor and a p-MOS transistor connected to each other via their drain and source terminals as is, for example, illustrated in FIG. 5 of the Japanese document JP 60-64506 cited in the preamble.

Oscillator circuit 10 further includes means for smoothing the amplitude of the alternating output signal, designated $S_{OSC}$, when the oscillator circuit is switched at the end of the start-up phase. These output signal amplitude smoothing means are advantageously made in the form of an amplitude control loop globally designated by the reference numeral 9. This amplitude control loop 9 is connected, on the one hand, to one of the input and output terminals A, B of oscillator circuit 10 (in this example, input terminal A), and, on the other hand, to first inverter 2.

Amplitude control loop 9 includes, on the one hand, an amplitude control circuit 90 and, on the other hand, at least one controlled current source 91, 92 (preferably two) connected in the supply path of inverter 2. In this example, an input terminal 90a of amplitude control 90 is connected to the input terminal A of the oscillator circuit, and two output terminals 90b, 90c are respectively connected to first and second controlled current sources 91, 92, placed on either side of inverter 2 in its supply path. By way of first improvement, each controlled current source 91, 92 is further connected in parallel to a resistive element 95, 96 respectively. We will return to the use of these resistive elements hereinafter.

Figure 3A:
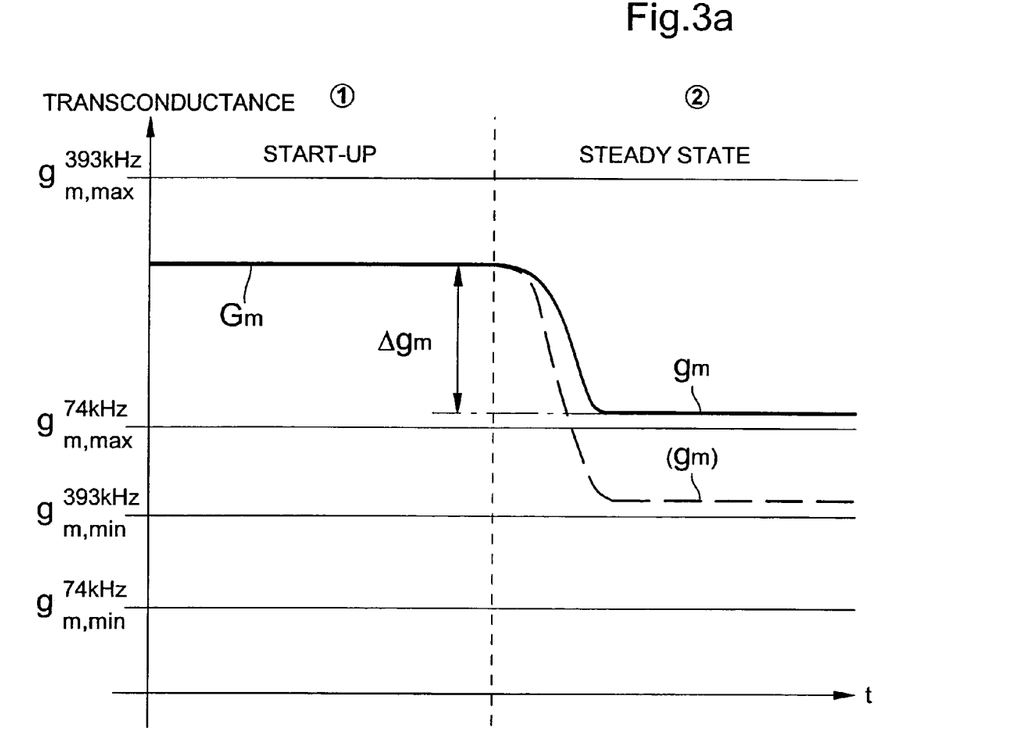
FIG. 3*a* illustrates the evolution over time of the transconductance value of the inverter oscillator circuit of FIG. 2, in particular during switching from a start-up phase to a steady state phase.
Figure 3B:
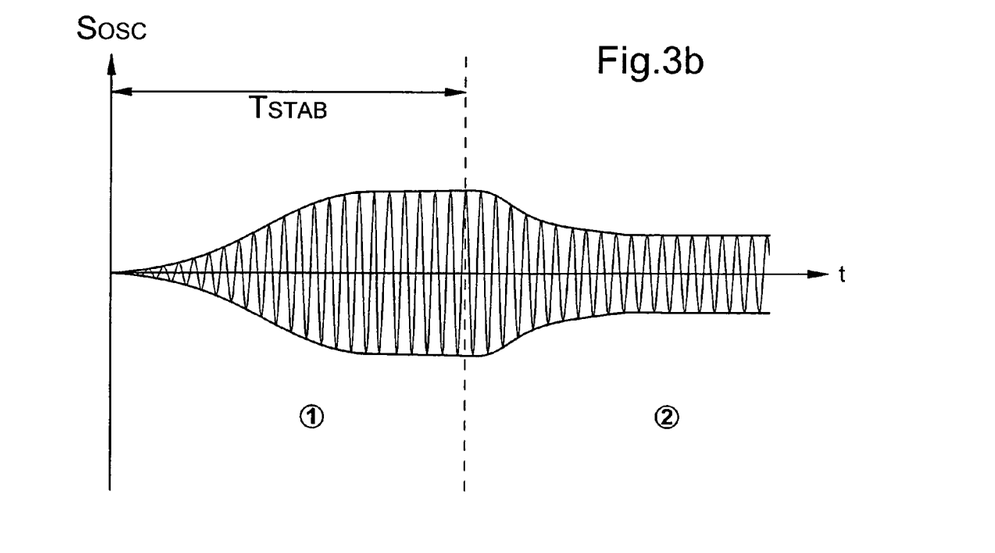
FIG. 3*b* illustrates the evolution over time of the amplitude of the oscillation signal delivered by the oscillator circuit of FIG. 2, in particular during switching from a start-up phase to a steady state phase.

With reference to FIGS. 3a and 3b, the operating principle of the inverter oscillator circuit according to the present invention will now be briefly described. FIG. 3a illustrates schematically the evolution over time of the transconductance value of the oscillator circuit according to the invention. In FIG. 3a, the oscillation conditions are also illustrated in terms of minimum ($g_{m,min}$—the lower oscillation condition) and maximum ($g_{m,max}$—the upper oscillation condition) transconductance values for the fundamental flexural (at 74 kHz) and torsional (393 kHz) vibration modes of the resonator taken by way of example in the aforementioned European Patent Application No. EP 1 111 770 A1. FIG. 3b illustrates schematically the corresponding evolution of the oscillator's alternating output signal $S_{OSC}$.

During the start-up phase of the oscillator circuit (phase "1"), the two inverters 2, 3 of the oscillator circuit are connected in parallel such that the circuit has a global so-called start-up transconductance value, designated $G_m$, of high value. It will be noted in this regard that the choice of a high transconductance value during the initial phase allows the start-up time of the oscillator circuit to be reduced.

In order to set the resonator into vibration according to the desired fundamental torsional vibration mode, the start-up transconductance value $G_m$ of the circuit is selected such that the oscillation conditions of the desired mode (namely the fundamental torsional vibration mode) are satisfied. These conditions are satisfied, in the example illustrated, for a start-up transconductance value $G_m$ comprised between the higher critical value $g_{m,max}$ of the undesired flexural vibration mode (at 74 kHz) and the higher critical value $g_{m,max}$ of the desired torsional vibration mode (at 393 kHz).

By satisfying the aforementioned conditions, the resonator is set in vibration according to the desired torsional vibration mode. As illustrated in FIG. 3b, the amplitude of output signal $S_{OSC}$ gradually increases and the oscillation frequency tends towards a stable state. By convention, it will be said that the oscillations are stabilised at the end of a determined interval of time, designated $T_{STAB}$.

At the end of the start-up phase, as soon as the oscillations of the oscillation circuit are stabilised (in steady state, phase "2" in the Figures), second inverter 3 is deactivated so as to reduce the circuit's transconductance value to a so-called reduced value, designated $g_m$, and thus to reduce the consumption of the circuit. For the sake of security, the reduced transconductance value $g_m$, is preferably determined such that it still satisfies the strict oscillation conditions of the desired torsional vibration mode. The inventor has nonetheless been able to observe that the transconductance value can be reduced to a value that no longer strictly satisfies the aforementioned oscillation conditions. In the example of FIG. 3a, it is, for example, possible to reduce the transconductance value of the circuit to a value comprised between the higher critical transconductance $g_{m,max}$ of the undesired flexural vibration mode and the lower critical transconductance $g_{m,min}$ of the desired torsional vibration mode, this possibility being illustrated in FIG. 3a by the curve in dotted lines. It will thus be understood that the present invention allows the consumption of the inverter circuit to be reduced below the consumption level defined by the lower oscillation condition, i.e. the higher critical transconductance value $g_{m,max}$ of the undesired flexural vibration mode (this value typically being higher than the lower critical transconductance value $g_{m,min}$ of the desired torsional vibration mode).

According to the present invention, the transition from the start-up transconductance value $G_m$ to the reduced transconductance value $g_m$ does not occur abruptly, but gradually, owing to the addition of the amplitude control loop connected to the first inverter of the oscillator circuit. This results in a gentle and gradual decrease in the amplitude of output signal $S_{OSC}$ as illustrated in FIG. 3b.

With reference again to FIG. 2, it will be noted that the consumption of the oscillator circuit can be further reduced by adding a resistive element 95, 96 in the supply path of first inverter 2 in parallel with each controlled current source 91, 92. The effect of the addition of these resistive elements is to limit the maximum current in the supply path of inverter 2 and thus to further reduce the consumption of the inverter oscillator circuit in steady state.

Also by way of improvement, it is possible to reduce the supply voltage at the terminals of the inverter oscillator circuit, i.e. to generate an intermediate supply potential, designated $V_R$, comprised between supply potentials $V_{DD}$ and $V_{SS}$.

Figure 4:
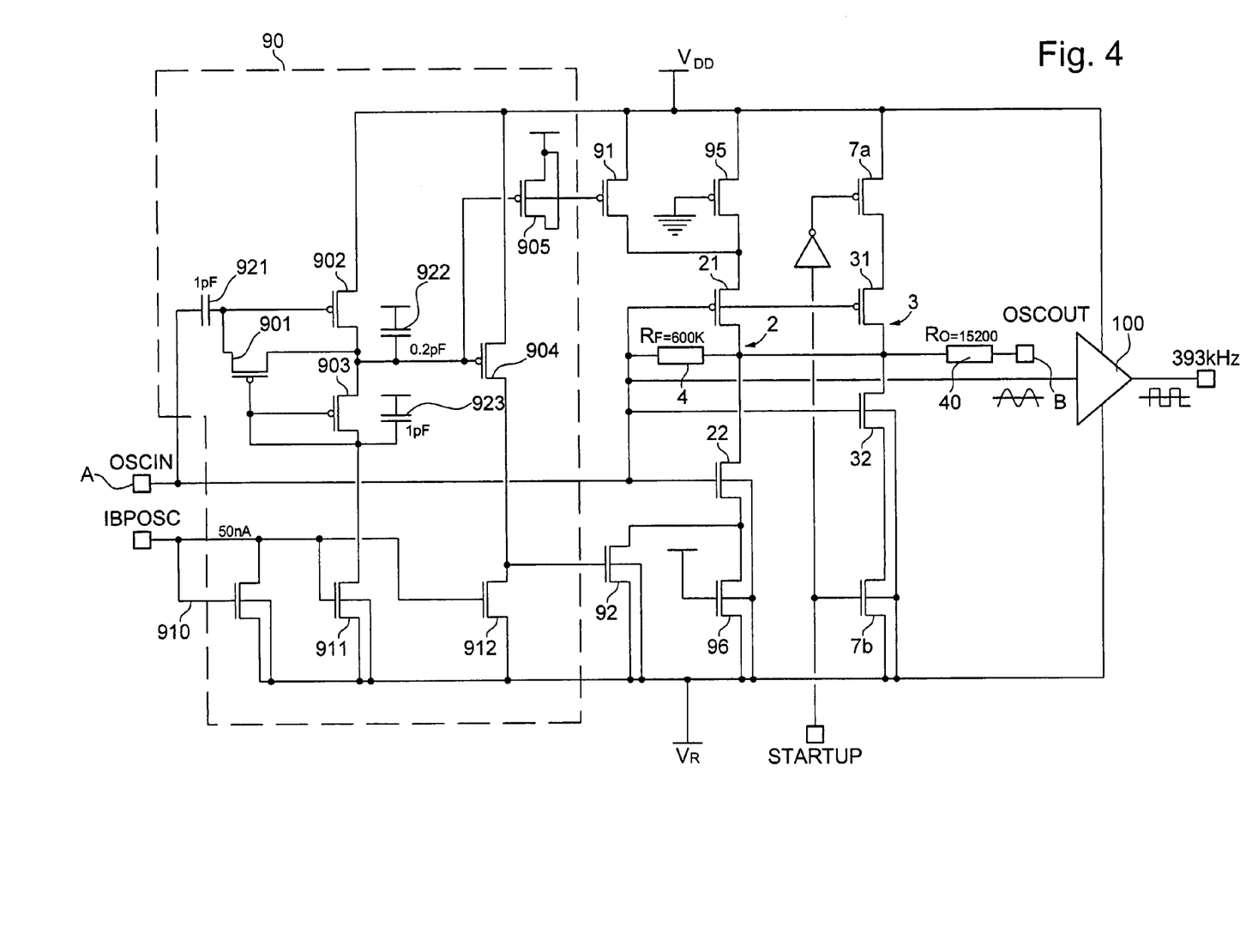
FIG. 4 is a detailed example of an embodiment of the oscillator circuit according to the invention.

FIG. 4 shows a detailed embodiment of the inverter oscillator circuit of FIG. 2. For the sake of clarity, resonator 1 (connected between terminals A and B) and load capacitors 5 and 6 (respectively connected to terminals A and B) have not been shown in FIG. 4.

The first and second inverters 2, 3 are CMOS inverters each comprising a p-MOS transistor 21, 31 respectively, whose drain is connected to the drain of an n-MOS transistor 22, 32 respectively. The gates of transistors 21, 22, 31 and 32 are connected to the same node and form input terminal A of the oscillator circuit. The drains of transistors 21, 22, 31, 32 are connected together to output terminal B, here via additional resistive element 40. The feedback resistive element 4 is connected between the gate connection node and the drain connection node of transistors 21, 22, 31, 32. The oscillator circuit output signal (picked up in this example at terminal A) is applied in a typical manner to the input of a shaping stage 100 for delivering a square output signal.

The source of p-MOS transistor 31 of second inverter 3 is connected to high supply potential $V_{DD}$ via another p-MOS transistor forming switch 7a. Likewise, the source of n-MOS transistor 32 of second inverter 3 is connected to the low supply potential (here intermediate supply potential $V_R$) via another n-MOS transistor forming switch 7b. A control signal designated STARTUP is applied to the gate of n-MOS transistor 7b and to the gate of p-MOS transistor 7a (via an inverter) in order to control their state of conduction and selectively activate or deactivate second inverter 3.

The source of p-MOS transistor 21 of first inverter 2 is connected to high supply potential $V_{DD}$ via another p-MOS transistor connected in a resistor configuration (gate potential brought to ground), this p-MOS transistor forming resistive element 95 of FIG. 2. A p-MOS transistor forming first controlled current source 91 is also inserted between the source of p-MOS transistor 21 and high potential $V_{DD}$ in parallel with transistor 95 connected as a resistor. Likewise, the source of n-MOS transistor 22 is connected to low supply potential $V_R$ via an n-MOS transistor connected in a resistor configuration (gate potential brought to high potential) and forms resistive element 96 of FIG. 2. An n-MOS transistor forming the second controlled current source 92 is inserted between the source of n-MOS transistor 22 and low potential $V_R$ in parallel with transistor 96 connected as a resistor.

P-MOS transistor 91 and n-MOS transistor 92 forming the controlled current sources are controlled by amplitude control circuit 90 whose structure will now be briefly described. It will be noted that those skilled in the art could envisage other configurations for making this amplitude control circuit and that the configuration illustrated should consequently not be considered as a limitation of the invention.

Input terminal A of the oscillator circuit is applied to a terminal of a first capacitive element 921, the other terminal of this capacitive element 921 being connected on the one hand, to the drain of a first p-MOS transistor 901 and, on the other hand, to the gate of a second p-MOS transistor 902. The source of the latter is connected to high potential $V_{DD}$ whereas its drain is connected to the source of first p-MOS transistor 901 as well as to the source of a third p-MOS transistor 903. The gate and the drain of this third p-MOS transistor 903 are connected to the gate of first transistor 901. The connection node between the drain of p-MOS transistor 902 and the sources of p-MOS transistors 901 and 903 is connected to the gate of a fourth p-MOS transistor 904 whose source is connected to high supply potential $V_{DD}$. Second 922 and third 923 capacitive elements are also connected via one of their terminals respectively to the drain of p-MOS transistor 902 and to the drain of p-MOS transistor 903, the other terminal of these capacitive elements 922 and 923 being connected to high supply potential $V_{DD}$.

The gate of p-MOS transistor forming first controlled current source 91 is connected to the gate of fourth p-MOS transistor 904, a fifth p-MOS transistor 905 connected in a capacitor configuration (drain and source terminals connected to high supply potential $V_{DD}$) being connected via its gate to this same connection between p-MOS transistors 91 and 904. The gate of the n-MOS transistor forming second controlled current source 92 is connected to the drain of fourth p-MOS transistor 904.

The biasing of the transistors of amplitude control circuit 90 is assured by a biaising current IBPOSC which is mirrored in the branch comprising p-MOS transistor 904 by means of a current mirror including three n-MOS transistors 910, 911 and 912, transistors 911 and 912 of the first and second output branches of the current mirror being respectively connected in series with p-MOS transistor 903 and p-MOS transistor 904.

Figure 5A:
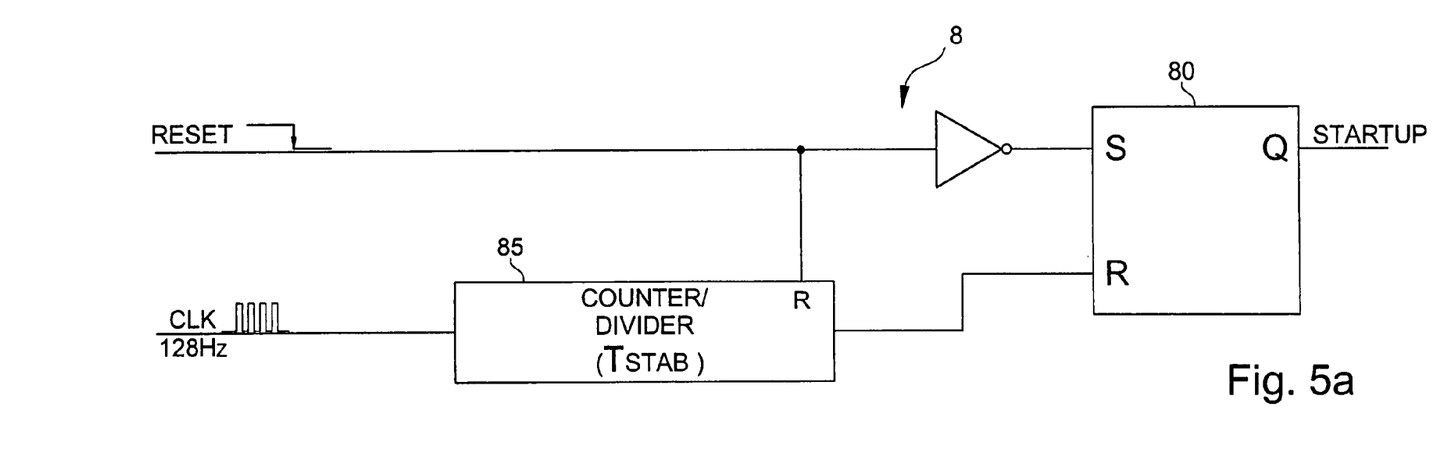
FIG. 5*a* is an embodiment example of a circuit generating a switching signal STARTUP allowing the oscillator circuit of FIG. 2 to switch from the start-up phase to the steady state phase.

FIG. 5a shows an embodiment example of control circuit 8 for generating control signal STARTUP intended for switches 7a and 7b. This control circuit 8, made in digital form, essentially includes a bistable trigger circuit (or flip-flop) S-R 80 and a counter, or divider 85. Counter 85 is clocked by a clock signal CLK (purely by way of illustrative and non-limiting example, a clock signal at 128 Hz derived from the oscillator circuit output signal). A zero reset signal RESET is applied to a zero reset terminal of counter 85 and to excitation terminal S of bistable trigger circuit 80, via an inverter. The counter is arranged to count a determined number of pulses, purely by way of illustrative example, sixteen pulses, and thus defines an interval of time of 16×1/128=125 ms in this example.

Figure 5B:
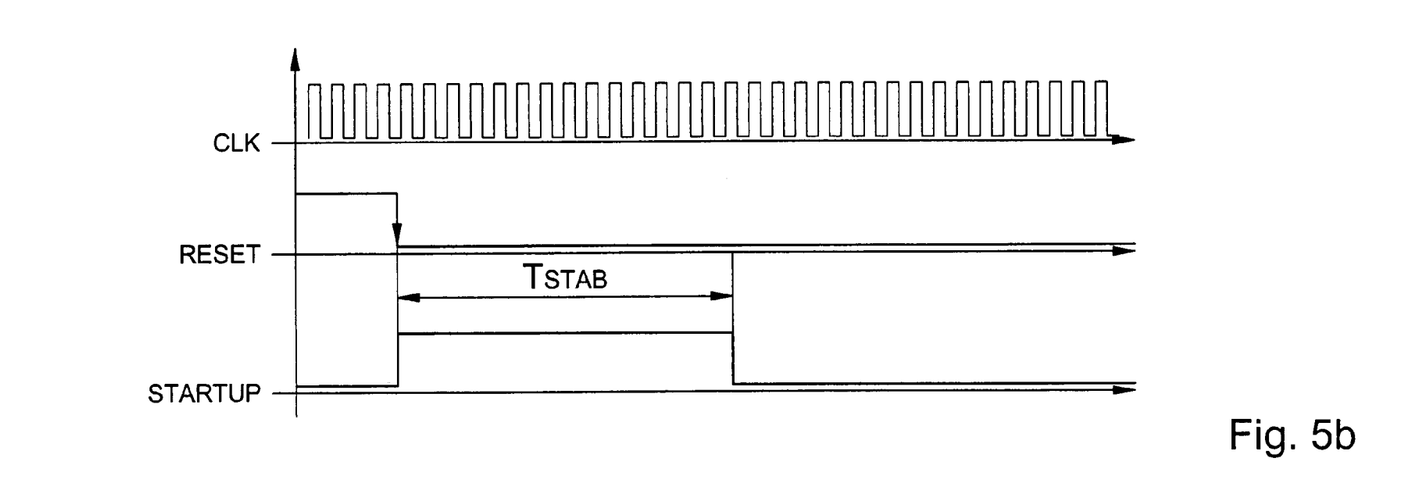
FIG. 5*b* is a diagram illustrating the evolution over time of the signals of the generator circuit of FIG. 5*a*.

As illustrated in the diagram of FIG. 5b, the switching signal STARTUP thus passes to the high logic level during a determined time interval of duration $T_{STAB}$. During this time interval, the oscillator circuit of FIG. 2 is thus switched into the "high transconductance" mode facilitating the quick start-up of the oscillations. As soon as the time interval has elapsed, signal STARTUP passes to the low logic level, thus switching the oscillator circuit of FIG. 2 into the "low transconductance" mode thus reducing the consumption of the circuit.

It will be understood that various modifications and/or improvements evident to those skilled in the art can be made to the embodiment described in the present description without departing from the scope of the invention defined by the annexed claims. For example, the solution based on the principle of FIG. 1a could also be applied insofar as the amplitude control loop avoids damping of the oscillations when the switch is switched.

The invention claimed is:

1. An inverter oscillator circuit for delivering an alternating output signal, this inverter oscillator circuit including a parallel arrangement, between an input terminal and an output terminal, of an inverter amplifier means, a resonator and a resistor, first and second load capacitors being respectively connected between said input and output terminals, on the one hand, and a supply potential, on the other hand, said inverter amplifier means including a first inverter having a first transconductance value, permanently connected between said input and output terminals, and a second inverter having a second transconductance value, this inverter oscillator circuit further including control means for controlling said inverter amplifier means such that it has a so-called start-up transconductance value during a start-up phase and a so-called reduced transconductance value, lower than said start-up transconductance value, in steady state at the end of said start-up phase, said control means including switching means arranged to connect said second inverter between said input and output terminals during said start-up phase and for disconnecting said second inverter in steady state at the end of said start-up phase, wherein the inverter oscillator circuit further includes an amplitude control loop for smoothing an amplitude decrease in the output signal resulting from the passage of said start-up transconductance value to said reduced transconductance value, said amplitude control loop being connected to said first inverter and controlling the amplitude of said alternating output signal in steady state, wherein said amplitude control loop comprises an amplitude control circuit connected to one of said input and output terminals and delivering a control signal to at least one current source arranged in said supply path of the first inverter, and wherein at least one resistor element is connected in series in the supply path of said first inverter in parallel with said at least one current source.

2. The inverter oscillator circuit according to claim 1, wherein said at least one resistor element is a MOS transistor connected as a resistor between the source terminal of one of said p-MOS or n-MOS transistors of said first inverter and one of said corresponding supply voltages.

3. An inverter oscillator circuit for delivering an alternating output signal, this inverter oscillator circuit including a parallel arrangement, between an input terminal and an output terminal, of an inverter amplifier means, a resonator and a resistor, first and second load capacitors being respectively connected between said input and output terminals, on the one hand, and a supply potential, on the other hand, said inverter amplifier means including a first inverter having a first transconductance value, permanently connected between said input and output terminals, and a second inverter having a second transconductance value, this inverter oscillator circuit further including control means for controlling said inverter amplifier means such that it has a so-called start-up transconductance value during a start-up phase and a so-called reduced transconductance value, lower than said start-up transconductance value, in steady state at the end of said start-up phase, said control means including switching means arranged to connect said second inverter between said input and output terminals during said start-up phase and for disconnecting said second inverter in steady state at the end of said start-up phase, wherein the inverter oscillator circuit further includes an amplitude control loop for smoothing an amplitude decrease in the output signal resulting from the passage of said start-up transconductance value to said reduced transconductance value, said amplitude control loop being connected to said first inverter and controlling the amplitude of said alternating output signal in steady state, and wherein said second inverter is selectively connected to or disconnected from said input and output terminals by means of first and second switches connected in series in the supply path of said second inverter, said first switch being a p-MOS transistor connected by its drain and source terminals between the source terminal of the p-MOS transistor of said second inverter and said first supply potential, said second switch being an n-MOS transistor connected by its drain and source terminals between the source terminal of the n-MOS transistor of said second inverter and said second supply potential.

4. An inverter oscillator circuit for delivering an alternating output signal, this inverter oscillator circuit including a parallel arrangement, between an input terminal and an output terminal, of an inverter amplifier means, a resonator and a resistor, first and second load capacitors being respectively connected between said input and output terminals, on the one hand, and a supply potential, on the other hand, said inverter amplifier means including a first inverter having a first transconductance value, permanently connected between said input and output terminals, and a second inverter having a second transconductance value, this inverter oscillator circuit further including control means for controlling said inverter amplifier means such that it has a so-called start-up transconductance value during a start-up phase and a so-called reduced transconductance value, lower than said start-up transconductance value, in steady state at the end of said start-up phase, said control means including switching means arranged to connect said second inverter between said input and output terminals during said start-up phase and for disconnecting said second inverter in steady state at the end of said start-up phase, wherein the inverter oscillator circuit further includes an amplitude control loop for smoothing an amplitude decrease in the output signal resulting from the passage of said start-up transconductance value to said reduced transconductance value, said amplitude control loop being connected to said first inverter and controlling the amplitude of said alternating output signal in steady state, and wherein said inverter oscillator circuit further includes a voltage control circuit for powering at least said first inverter with a reduced supply potential.

5. An inverter oscillator circuit for delivering an alternating output signal, this inverter oscillator circuit including a parallel arrangement, between an input terminal and an output terminal, of an inverter amplifier means, a resonator and a resistor, first and second load capacitors being respectively connected between said input and output terminals, on the one hand, and a supply potential, on the other hand, said inverter amplifier means including a first inverter having a first transconductance value, permanently connected between said input and output terminals, and a second inverter having a second transconductance value, this inverter oscillator circuit further including control means for controlling said inverter amplifier means such that it has a so-called start-up transconductance value during a start-up phase and a so-called reduced transconductance value, lower than said start-up transconductance value, in steady state at the end of said start-up phase, said control means including switching means arranged to connect said second inverter between said input and output terminals during said start-up phase and for disconnecting said second inverter in steady state at the end of said start-up phase, wherein the inverter oscillator circuit further includes an amplitude control loop for smoothing an amplitude decrease in the output signal resulting from the passage of said start-up transconductance value to said reduced transconductance value, said amplitude control loop being connected to said first inverter and controlling the amplitude of said alternating output signal in steady state, wherein said resonator is a quartz resonator having at least a fundamental torsional vibration mode, and wherein said start-up transconductance value is determined such that the resonator is set into vibration according to said fundamental torsional vibration mode at least during said start-up phase, and wherein said resonator has a single cut angle defined by a rotation at a determined angle about the crystallographic axis X of said quartz, such that said resonator includes at least an undesired fundamental flexural vibration mode at a first frequency and said desired fundamental torsional vibration mode at a second frequency higher than said first frequency, said start-up transconductance value being determined such that said resonator is set into vibration according to said desired fundamental torsional vibration mode and not according to said undesired fundamental flexural vibration mode.

6. An inverter oscillator circuit for delivering an alternating output signal, this inverter oscillator circuit including a parallel arrangement, between an input terminal and an output terminal, of an inverter amplifier means, a resonator and a resistor, first and second load capacitors being respectively connected between said input and output terminals, on the one hand, and a supply potential, on the other hand, said resonator being a quartz resonator having a first undesired vibration mode at a first frequency and a second desired vibration mode at a second frequency, wherein said inverter oscillator circuit further includes:

control means for controlling said inverter amplifier means such that it has a so-called start-up transconductance value during a start-up phase and a so-called reduced transconductance value, lower than said start-up transconductance value, in steady state at the end of said start-up phase; and means for smoothing an amplitude decrease in the output signal resulting from the passage of said start-up transconductance value to said reduced transconductance value, said start-up transconductance value being determined such that the resonator is set into vibration according to said second desired vibration mode during said start-up phase, and said reduced transconductance value is determined such that the resonator continues to vibrate according to the second desired vibration mode in steady state.

7. The inverter oscillator circuit according to claim 6, wherein said resonator has a single cut angle defined by a rotation at a determined angle about the crystallographic axis X of said quartz, said first undesired vibration mode being a fundamental flexural vibration mode at a first frequency and said second desired fundamental vibration mode being a fundamental torsional vibration mode at a second frequency higher than said first frequency.

8. The inverter oscillator circuit according to claim 6, wherein the maximum transconductance value, or upper oscillation condition, associated with the first undesired vibration mode is located between the maximum transconductance value and minimum transconductance value, or lower oscillation condition, associated with the second desired vibration mode, said start-up transconductance value being determined to be between the maximum transconductance values associated with said first undesired vibration mode and said second desired vibration mode.

9. The inverter oscillator circuit according to claim 8, wherein the reduced transconductance value is determined to be between the maximum transconductance value, or upper oscillation condition, associated with said first undesired vibration mode, and the minimum transconductance value, or lower oscillation condition, associated with said second desired vibration mode.

10. A method for maintaining the vibrations of a resonator and generating an alternating output signal by means of an inverter oscillator circuit including an inverter amplifier means, this resonator having a first undesired vibration mode at a first frequency and a second desired vibration mode at a second frequency, this method including:

a start-up step consisting in controlling said inverter amplifier means such that it has a so-called start-up transconductance value during said staff-up step, this start-up transconductance value being determined such that said resonator is set into vibration according to the desired vibration mode; and a switching step consisting in controlling said inverter amplifier means such that it has a so-called reduced transcondctance value lower than said start-up transconductance value as soon as said resonator is in steady state.

11. The method according to claim 10, wherein said switching step also consists in smoothing the amplitude decrease in said alternating output signal resulting from the passage of said start-up transconductance value to said reduced transconductance value.

12. The method according to claim 10, wherein said first undesired vibration mode is a flexural vibration mode and wherein said second desired vibration mode is a torsional vibration mode at a higher frequency than the frequency of said flexural vibration mode.

* * * * *